(12) United States Patent
Hashimoto

(10) Patent No.: US 6,351,166 B2
(45) Date of Patent: *Feb. 26, 2002

(54) SEMICONDUCTOR DEVICE WITH STABLE AND APPROPRIATE DATA OUTPUT TIMING

(75) Inventor: Yukinori Hashimoto, Kawasaki (JP)

(73) Assignee: Fujitsu Limited, Kanagawa (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/109,897

(22) Filed: Jul. 2, 1998

(30) Foreign Application Priority Data

Jan. 27, 1998 (JP) .......................................... 10-014388

(51) Int. Cl.[7] .......................... H03K 5/14; H03K 11/20
(52) U.S. Cl. ...................... 327/158; 327/244; 327/276
(58) Field of Search .................................. 327/155, 156, 327/158, 236, 243, 244, 263, 270, 276; 365/194, 195, 233; 331/1 A, 74; 360/51; 375/371, 373, 376, 243, 244

(56) References Cited

U.S. PATENT DOCUMENTS

| | | | | |
|---|---|---|---|---|
| 4,270,206 A | * | 5/1981 | Hughes | 375/223 |
| 5,740,123 A | * | 4/1998 | Uchida | 365/233 |
| 5,900,754 A | * | 5/1999 | Nakatani | 327/158 |
| 5,936,912 A | * | 8/1999 | Kawabata et al. | 365/233 |
| 5,939,913 A | * | 8/1999 | Tomita | 327/159 |
| 5,955,904 A | * | 9/1999 | Kawasaki | 327/156 |

FOREIGN PATENT DOCUMENTS

| | | | | |
|---|---|---|---|---|
| JP | A 61-228725 | 10/1986 | ............. | H03L/3/00 |
| JP | A 3-30518 | 2/1991 | ............. | H03L/7/14 |

* cited by examiner

Primary Examiner—Timothy P. Callahan
Assistant Examiner—Terry L. Englund
(74) Attorney, Agent, or Firm—Arent Fox Kintner Plotkin & Kahn, PLLC

(57) ABSTRACT

A semiconductor device includes a timing-stabilization circuit which adjusts a phase of the synchronization clock signal. The semiconductor device further includes a control circuit which suspends the adjustment of the phase of the synchronization clock by the timing-stabilization circuit during a time period when the data is output from an output circuit.

6 Claims, 8 Drawing Sheets

US 6,351,166 B2

SEMICONDUCTOR DEVICE WITH STABLE AND APPROPRIATE DATA OUTPUT TIMING

BACKGROUND OF THE INVENTION

1. Field of the Invention

The present invention generally relates to semiconductor devices, and particularly relates to a semiconductor device equipped with a timing-stabilization circuit such as a DLL (delay-locked loop) circuit.

2. Description of the Related Art

Some semiconductor devices control a timing of a clock signal by use of a DLL circuit or the like.

FIG. 1 is a block diagram of a configuration in which a DLL circuit is used as a timing-stabilization circuit for data-output operations.

The configuration of FIG. 1 includes an output circuit 501, a variable-delay circuit 502, an ESD-protection circuit 503, an input circuit 504, a frequency divider 505, a phase-comparison circuit 506, a delay-control circuit 507, a variable-delay circuit 508, a dummy-input circuit 509, a dummy-output circuit 510, a dummy-output load 511, and a dummy-ESD-protection circuit 512.

An external clock signal CLK input to an input node is supplied to the input circuit 504 via the ESD-protection circuit 503. The input circuit 504 is comprised of a current-mirror circuit or the like. The input circuit 504 generates an internal-clock signal i-clk based on the external clock signal CLK supplied thereto. The internal-clock signal i-clk is delayed by the variable-delay circuit 502 by an appropriate delay amount, and is supplied to the output circuit 501. The output circuit 501 uses the internal-clock signal i-clk having the appropriate delay amount as a synchronization signal so as to latch data. The latched data is then supplied from the output circuit 501 to an exterior of the semiconductor device via an output node.

The signal path from the input node to the output node inevitably introduces a delay which is inherent to the circuit, so that the data output to the exterior of the device has a timing determined by the delay inherent to the circuit. In order to ensure that the data output to the exterior of the device is adjusted to have a predetermined timing relation with the external clock signal CLK, a DLL circuit mainly comprised of the phase-comparison circuit 506, the delay-control circuit 507, the variable-delay circuit 508, and the variable-delay circuit 502 is employed.

The internal-clock signal i-clk is subjected to frequency division in the frequency divider 505 to generate a dummy-clock signal d-clk and a reference-clock signal c-clk having the same phase as the dummy-clock signal d-clk. The dummy-clock signal d-clk is supplied to the variable-delay circuit 508. The variable-delay circuit 508 is controlled to delay the dummy-clock signal d-clk by the same delay amount as that applied by the variable-delay circuit 502. The dummy-clock signal d-clk delayed by the variable-delay circuit 508 is then supplied to the phase-comparison circuit 506 via the dummy-output circuit 510, the dummy-output load 511, the dummy-ESD-protection circuit 512, and the dummy-input circuit 509. Here, the dummy-output circuit 510 has the same delay characteristics as the output circuit 501, and the dummy-output load 511 emulates the output load of the device. Further, the dummy-ESD-protection circuit 512 has the same delay characteristics as the ESD-protection circuit 503, and the dummy-input circuit 509 has the same delay characteristics as the input circuit 504.

The phase-comparison circuit 506 makes a comparison of the reference-clock signal c-clk with the clock signal supplied from the dummy-input circuit 509. To ensure that both clock signals have the same phase, the phase-comparison circuit 506 controls the delay amount of the variable-delay circuit 508 via the delay-control circuit 507. In this manner, the clock signal output from the dummy-output circuit 510 is adjusted so as to have a predetermined timing relation with the external clock signal CLK.

A total delay of the ESD-protection circuit 503, the input circuit 504, the variable-delay circuit 502, and the output circuit 501 is equal to a total delay of the dummy-ESD-protection circuit 512, the dummy-input circuit 509, the variable-delay circuit 508 and the dummy-output circuit 510. Because of this, the data output from the output circuit 501 to the exterior of the device ends up having the predetermined timing relation with the external clock signal CLK.

In this configuration, even when the characteristics of the ESD-protection circuit 503, the input circuit 504, the variable-delay circuit 502, and the output circuit 501 are changed due to variations in a power voltage and/or temperature, the characteristics of the dummy-ESD-protection circuit 512, the dummy-input circuit 509, the variable-delay circuit 508, and the dummy-output circuit 510 also change in the same manner. Because of this, the data output from the output circuit 501 to the exterior of the device always keeps the same timing relation with the external clock signal CLK regardless of a power-voltage variation and/or a temperature variation.

The frequency divider 505 divides a frequency of the internal-clock signal i-clk by N so as to generate the dummy-clock signal d-clk and the reference-clock signal c-clk. The phase-comparison circuit 506 thus makes a phase comparison once in every N cycles, thereby attending to timing adjustment. In the semiconductor device having the configuration of FIG. 1, the DLL circuit is always in operation, so that the timing adjustment is performed in every N cycles even during a data-output operation.

When data is output from an output circuit, in general, it is necessary to drive the output load attached to the output node. Because of this, the output circuit consumes a large amount of an electric current at an instance when the data is output, thereby generating a huge noise in an internal power voltage of the semiconductor device. When the internal power voltage suffers a huge noise, a series of dummy circuits including the variable-delay circuit 508 create a fluctuation in a signal timing as a signal passes therethrough. As a consequence, a clock signal t-clk, which is supplied from the dummy-input circuit 509 for a phase comparison by the phase-comparison circuit 506, ends up having an undesirable timing displacement.

FIGS. 2A through 2G are timing charts for explaining a problem caused by a power-voltage noise at a time of a data-output operation.

FIGS. 2A through 2G show the internal-clock signal i-clk, a read-enable signal, a data signal appearing at the output node, a ground voltage GND, the clock signal t-clk output from the dummy-input circuit 509, the reference-clock signal c-clk, and a clock signal observed at nodes N1 and N2 of FIG. 1, respectively.

As shown in the figures, when data D1 is output from the output node as the read-enable signal is supplied to the semiconductor device, the load is imposed on the output circuit 501, thereby creating a spike noise S1 in the power voltage (ground voltage GND). The noise S1 in the power voltage results in a timing of a rising edge being displaced with respect to a clock pulse P1 of the clock signal t-clk. If a pulse of the reference-clock signal c-clk that is supplied once in every N cycles happens to appear with the displaced clock pulse P1, a phase adjustment of the DLL circuit is performed in accordance with the displaced clock pulse P1, thereby changing the delay amount of the variable-delay circuit 502 and the variable-delay circuit 508. As a result, the clock signal appearing at the nodes N1 and N2 ends up having an erroneous timing which is caused by the displaced clock pulse P1. Data D2 output at the output node, therefore, appears at a wrong timing indicated by solid lines in FIG. 2C rather than at a correct timing shown by dashed lines.

In general, a fluctuation in the power voltage is compensated for by a timing adjustment which the DLL circuit performs. In order for such a timing adjustment to be effective, however, the power voltage should remain at a given voltage after changing from a previous voltage to this given voltage. In this case, the timing adjustment by the DLL circuit can insure that an appropriate timing is introduced with respect to the given voltage. In the case shown in FIGS. 2A through 2G, however, a fluctuation in the power voltage is a noise which appears only for a matter of a short moment, such that the power voltage changes from an original voltage to a next voltage, and immediately returns to the original voltage. In such a case, as shown in the figures, the data D2 is output at a wrong timing rather than at a correct timing which is adjusted under the conditions of the original voltage.

The output circuit 501 is provided with respect to each bit of the output data, so that the semiconductor device in its entirety is equipped with a plurality of output circuits. A power-voltage noise which is generated by a simultaneous operation of these output circuits tends to be relatively large, resulting in a significant timing displacement in the output data.

Accordingly, there is a need for a semiconductor device which is equipped with a timing-stabilization circuit, and is capable of maintaining an appropriate data-output timing even when a significant power-voltage noise is generated by a data-output operation.

SUMMARY OF THE INVENTION

Accordingly, it is a general object of the present invention to provide a semiconductor device which can satisfy the need described above.

It is another and more specific object of the present invention to provide a semiconductor device which is equipped with a timing-stabilization circuit, and is capable of maintaining an appropriate data-output timing even when a significant power-voltage noise is generated by a data-output operation.

In order to achieve the above objects, a semiconductor device according to the present invention includes a timing-stabilization circuit which adjusts an output timing of data based on an external clock signal such that the data is output at the output timing to an exterior of the semiconductor device, and a control circuit which stops an output-timing adjustment operation of the timing-stabilization circuit during a time period when the data is output.

According to one aspect of the present invention, the semiconductor device described above further includes an output circuit which outputs the data to the exterior in synchronism with a synchronization clock signal generated from the external clock signal, the timing-stabilization circuit adjusting a phase of the synchronization clock signal in order to adjust the output timing.

According to another aspect of the present invention, the semiconductor device described above is such that the timing-stabilization circuit includes a DLL circuit.

According to another aspect of the present invention, the semiconductor device described above is such that the timing-stabilization circuit includes a first variable-delay circuit which adjusts a phase of the synchronization clock signal, an emulation circuit which includes a second variable-delay circuit having a delay amount thereof set to the same amount as that of the first variable-delay circuit, and emulates a phase relation between the external clock signal and the output timing, a phase-comparison circuit which checks the phase relation emulated by the emulation circuit, and a delay-control circuit which adjusts the delay amount of the first variable-delay circuit and the second variable-delay circuit based on a check made by the phase-comparison circuit.

According to another aspect of the present invention, the semiconductor device described above is such that the control circuit supplies a clock signal derived from the external clock signal to the emulation circuit and the phase-comparison circuit to prompt performing of the output-timing adjustment operation during a time period when the data is not output, and stops supply of the clock signal derived from the external clock signal to the emulation circuit and the phase-comparison circuit to stop the output-timing adjustment operation during the time period when the data is output.

According to another aspect of the present invention, the semiconductor device described above is such that the control circuit learns whether the data is being output based on a signal which instructs outputting of the data to the exterior of the semiconductor device.

According to another aspect of the present invention, the semiconductor device described above is such that the signal which instructs outputting of the data to the exterior of the semiconductor device is set based on an input from the exterior of the semiconductor device.

According to another aspect of the present invention, a semiconductor device includes an output circuit which outputs data, a timing-stabilization circuit which adjusts an output timing of the data, and a control circuit which stops an adjustment of the output timing of the data during a time period when the output circuit outputs the data.

In the semiconductor devices described above, the control circuit is provided, and stops the output-timing-adjustment operation performed by the timing-stabilization circuit during a time period of data output. Because of this, even when a noise is generated in a power voltage by the data-output operation, the timing-stabilization circuit does not set a wrong timing. This makes it possible to output data at an appropriate timing regardless of a presence of the power-voltage noise.

Accordingly, an access time to read data can be free from an undesirable fluctuation in semiconductor devices such as DRAMs.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 1:
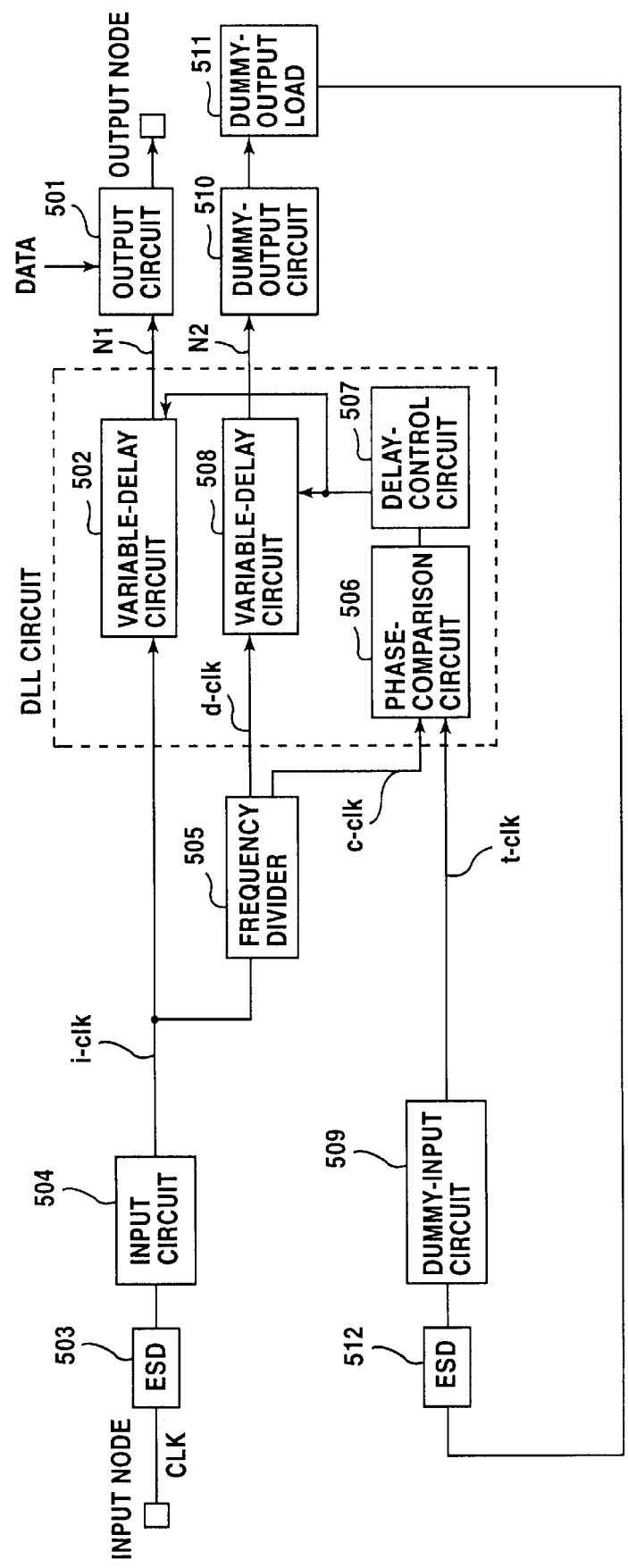
FIG. 1 is a block diagram of a related-art configuration in which a DLL circuit is used as a timing-stabilization circuit for data-output operations.
Figure 2:
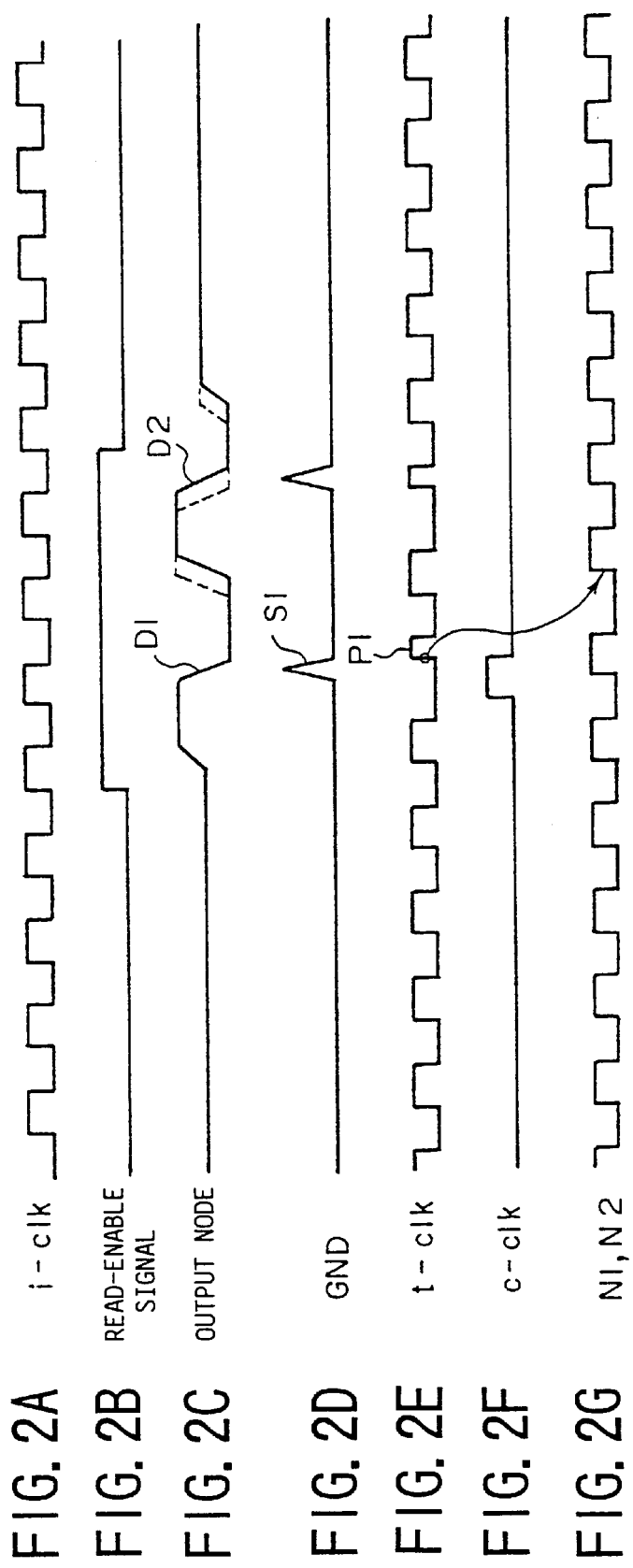
FIGS. 2A through 2G are timing charts for explaining a problem caused by a power-voltage noise at a time of a data-output operation when the configuration of FIG. 1 is used.
Figure 3:
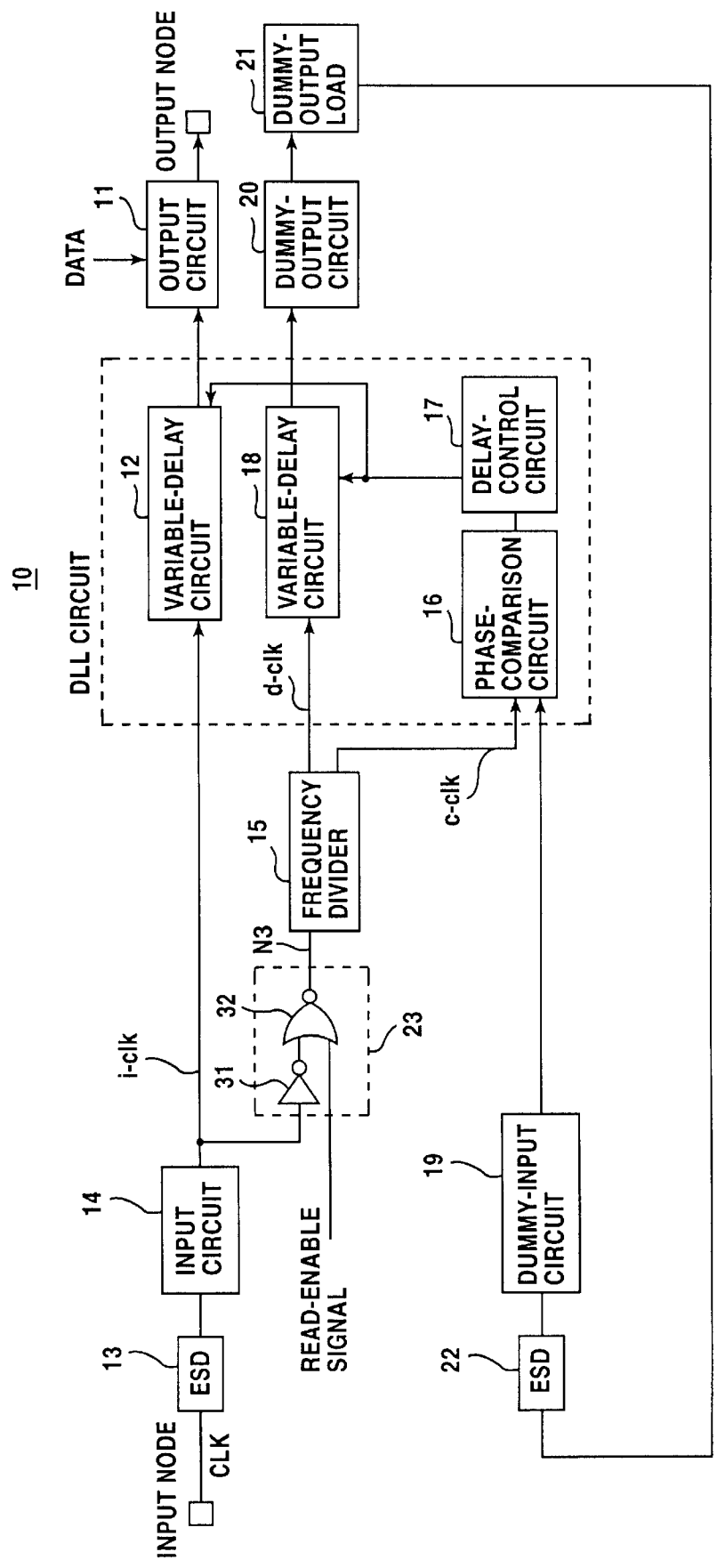
FIG. 3 is a block diagram showing an embodiment of a semiconductor device in which a DLL circuit is used as a timing-stabilization circuit according to the present invention.

FIG. 3 is a block diagram showing an embodiment of a semiconductor device in which a DLL circuit is used as a timing-stabilization circuit according to the present invention.

A semiconductor device 10 of FIG. 3 includes an output circuit 11, a variable-delay circuit 12, an ESD-protection circuit 13, an input circuit 14, a frequency divider 15, a phase-comparison circuit 16, a delay-control circuit 17, a variable-delay circuit 18, a dummy-input circuit 19, a dummy-output circuit 20, a dummy-output load 21, a dummy-ESD-protection circuit 22, and a control circuit 23.

An external clock signal CLK input to an input node is supplied to the input circuit 14 via the ESD-protection circuit 13. The input circuit 14 is comprised of a current-mirror circuit or the like. The input circuit 14 generates an internal-clock signal i-clk based on the external clock signal CLK supplied thereto. The internal-clock signal i-clk is delayed by the variable-delay circuit 12 by an appropriate delay amount, and is supplied to the output circuit 11. The output circuit 11 uses the internal-clock signal i-clk having the appropriate delay amount as a synchronization signal so as to latch data. The latched data is then supplied from the output circuit 11 to an exterior of the semiconductor device via an output node.

The signal path from the input node to the output node inevitably introduces a delay which is inherent to the circuit, so that the data output to the exterior of the device has a timing determined by the delay inherent to the circuit. In order to ensure that the data output to the exterior of the device is adjusted to have a predetermined timing relation with the external clock signal CLK, a DLL circuit mainly comprised of the phase-comparison circuit 16, the delay-control circuit 17, the variable-delay circuit 18, and the variable-delay circuit 12 is employed.

The internal-clock signal i-clk is subjected to frequency division in the frequency divider 15 to generate a dummy-clock signal d-clk and a reference-clock signal c-clk having the same phase as the dummy-clock signal d-clk. The dummy-clock signal d-clk is supplied to the variable-delay circuit 18. The variable-delay circuit 18 is controlled to delay the dummy-clock signal d-clk by the same delay amount as that applied by the variable-delay circuit 12. The dummy-clock signal d-clk delayed by the variable-delay circuit 18 is then supplied to the phase-comparison circuit 16 via the dummy-output circuit 20, the dummy-output load 21, the dummy-ESD-protection circuit 22, and the dummy-input circuit 19. Here, the dummy-output circuit 20 has the same delay characteristics as the output circuit 11, and the dummy-output load 21 emulates the output load of the device. Further, the dummy-ESD-protection circuit 22 has the same delay characteristics as the ESD-protection circuit 13, and the dummy-input circuit 19 has the same delay characteristics as the input circuit 14.

The phase-comparison circuit 16 makes a comparison of the reference-clock signal c-clk with the clock signal supplied from the dummy-input circuit 19. To ensure that both clock signals have the same phase, the phase-comparison circuit 16 controls the delay amount of the variable-delay circuit 18 via the delay-control circuit 17. In this manner, the clock signal output from the dummy-output circuit 20 is adjusted so as to have a predetermined timing relation with the external clock signal CLK.

A total delay of the ESD-protection circuit 13, the input circuit 14, the variable-delay circuit 12, and the output circuit 11 is equal to a total delay of the dummy-ESD-protection circuit 22, the dummy-input circuit 19, the variable-delay circuit 18, and the dummy-output circuit 20. Because of this, the data output from the output circuit 11 to the exterior of the device ends up having the predetermined timing relation with the external clock signal CLK.

In this configuration, even when the characteristics of the ESD-protection circuit 13, the input circuit 14, the variable-delay circuit 12, and the output circuit 11 are changed due to variations in a power voltage and/or temperature, the characteristics of the dummy-ESD-protection circuit 22, the dummy-input circuit 19, the variable-delay circuit 18, and the dummy-output circuit 20 also change in the same manner. Because of this, the data output from the output circuit 11 to the exterior of the device always keeps the same timing relation with the external clock signal CLK regardless of a power-voltage variation and/or a temperature variation.

The semiconductor device 10 of FIG. 3 is provided with the control circuit 23 according to the present invention. The control circuit 23 includes an inverter 31 and a NOR circuit 32. The control circuit 23 receives a read-enable signal. The read enable signal is supplied to read data from the semiconductor device 10. When the read-enable signal is LOW (inactive), the NOR circuit 32 serves as an inverter with respect to an output of the inverter 31. In this case, therefore, the internal-clock signal i-clk is supplied to the frequency divider 15 without any change.

When the read-enable signal is HIGH (active), the output of the NOR circuit 32 is fixed to LOW. In this case, therefore, the frequency divider 15 is not provided with any clock signal. In other words, the DLL circuit does not attend to phase adjustment when data is output from the output circuit 11 of the semiconductor device 10.

Figure 4:
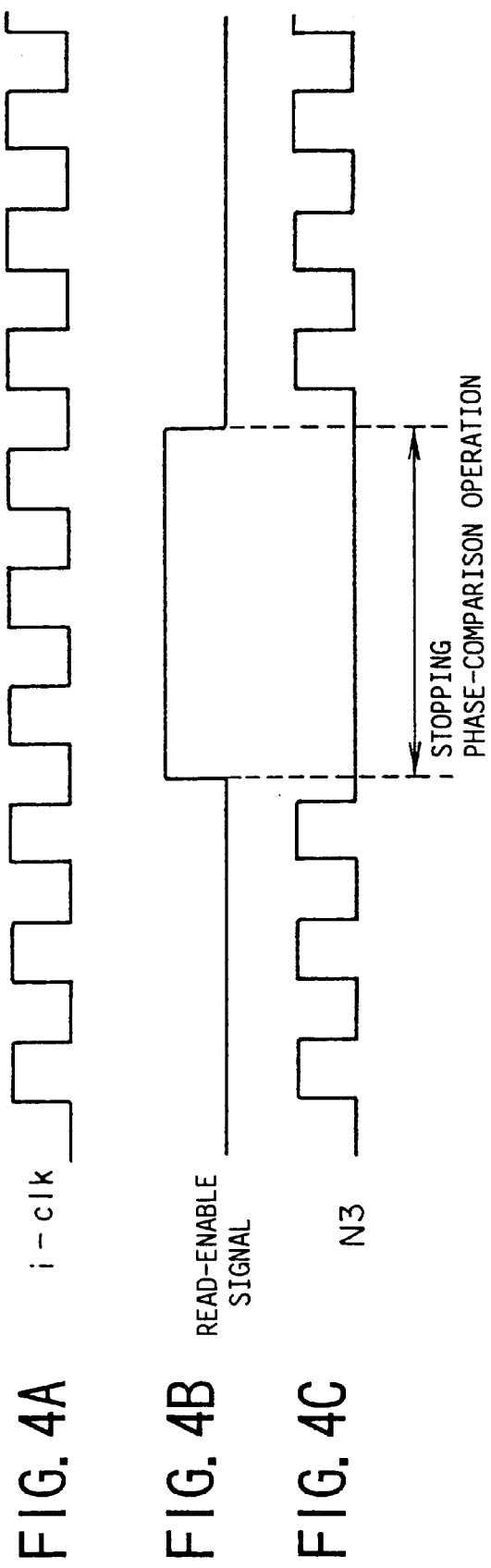
FIGS. 4A through 4C are timing charts for explaining a stoppage of a phase-comparison operation during when data is output.

FIGS. 4A through 4C are timing charts for explaining a stoppage of a phase-comparison operation during when data is output. FIGS. 4A through 4C show the internal-clock signal i-clk, the read-enable signal, and a signal observed at a node N3 of FIG. 3 as an output of the NOR circuit 32, respectively.

As shown in the figures, when the read-enable signal is HIGH to indicate a data-output operation, the signal at the node N3 is fixed to LOW, so that no clock pulse is supplied to the frequency divider 15. That is, the phase-comparison circuit 16 does not perform a phase-comparison operation during a time when data is output from the device.

As described above, the semiconductor device according to the present invention is provided with the control circuit which stops a phase-comparison operation and a phase-adjustment operation by the DLL circuit during a time period of data output. Because of this, even when a noise is generated in a power voltage by the data-output operation, the DLL circuit does not set a wrong timing. This makes it possible to output data at an appropriate timing regardless of a presence of the power-voltage noise.

The dummy-output circuit 20 operates when the read-enable signal is LOW (i.e., when data is not output), so that the power voltage cannot be free from noise. Since only one dummy-output circuit 20 is provided in one semiconductor device, however, the power-voltage noise is relatively small, thereby producing only a negligible influence on the phase-adjustment operations.

Figure 5:
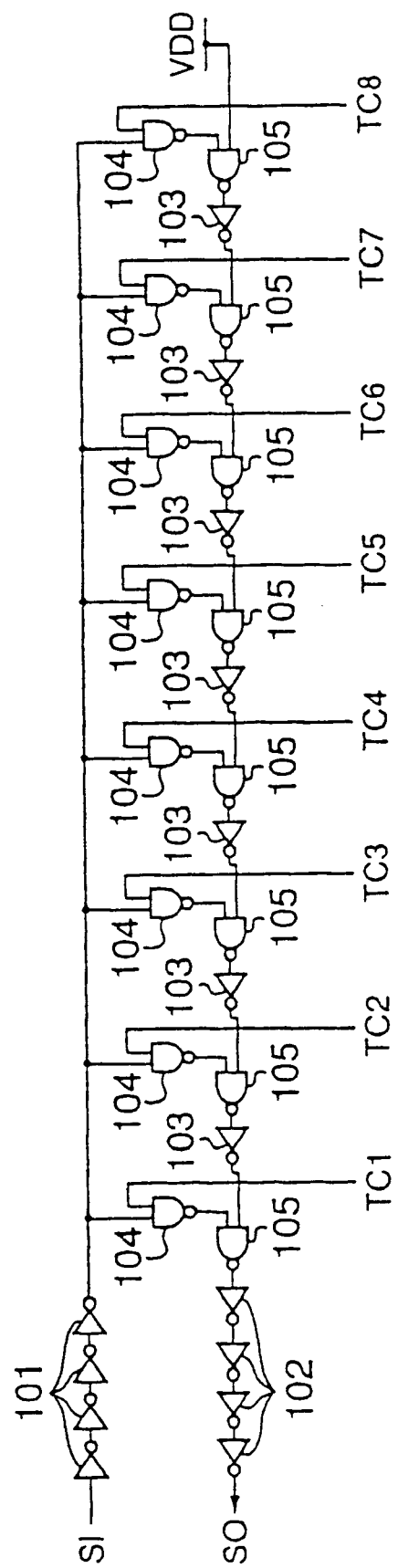
FIG. 5 is a circuit diagram showing a circuit structure of a variable-delay circuit.

FIG. 5 is a circuit diagram showing a circuit structure of a variable-delay circuit. The variable-delay circuit of FIG. 5 is used as the variable-delay circuits 12 and 18 in FIG. 3.

The variable-delay circuit of FIG. 5 includes a plurality of inverters 101, a plurality of inverters 102, a plurality of inverters 103, a plurality of NAND circuits 104, and a plurality of NAND circuits 105. A given one of the inverters 103 and a corresponding one of the NAND circuits 105 together form one stage of a delay element, such that the plurality of inverters 103 and the plurality of NAND circuits 105 together form a series of delay elements having a plurality of delay stages. Control signals TC1 through TC8 are supplied to the NAND circuits 104, and are provided from the delay-control circuit 17. A detailed description of the control signals TC1 through TC8 will be provided later. For the understanding of the circuit operations of FIG. 5, it should be pointed out that only two adjacent signals are HIGH among the control signals TC1 through TC8, and the remaining control signals are LOW.

An input signal S1 is supplied to the plurality of NAND circuits 104 via the plurality of inverters 101. The input signal S1 passes through a given one of the NAND circuits 104 when this NAND circuit 104 receives a HIGH signal as one of the control signals TC1 through TC8, and enters the series of delay elements comprised of the plurality of inverters 103 and the plurality of NAND circuits 105. The input signal SI propagates through the series of delay elements, and is output as an output signal SO after passing through the plurality of inverters 102. Depending on a position of the two adjacent signals which are HIGH among the control signals TC1 through TC8, the input signal SI passes through a different number of delay stages. Control of this position makes it possible to adjust how much the input signal SI is delayed.

Figure 6:
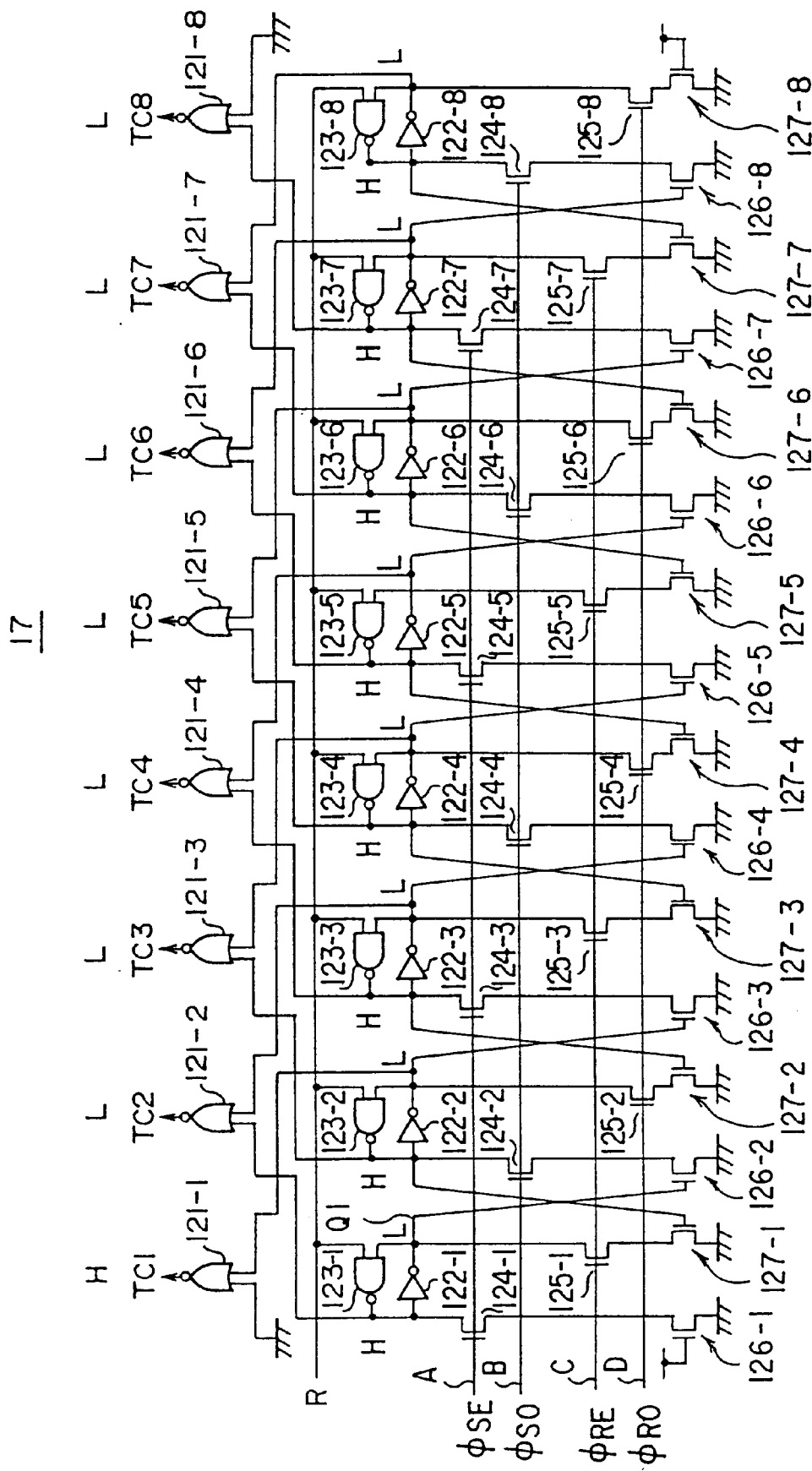
FIG. 6 is a circuit diagram showing a circuit configuration of a delay-control circuit.

FIG. 6 is a circuit diagram showing a circuit configuration of the delay-control circuit 17. The delay-control circuit 17 generates the control signals TC1 through TC8 described above.

The delay-control circuit 17 includes NOR circuits 121-1 through 121-8, inverters 122-1 through 122-8, NAND circuits 123-1 through 123-8, NMOS transistors 124-1 through 124-8, NMOS transistors 125-1 through 125-8, NMOS transistors 126-1 through 126-8, and NMOS transistors 127-1 through 127-8. When a reset signal R is turned to LOW, the delay-control circuit 17 is reset. Namely, when the reset signal R becomes LOW, outputs of the NAND circuits 123-1 through 123-8 become HIGH, and outputs of the inverters 122-1 through 122-8 become LOW. A pair of a given one of the NAND circuits 123-1 through 123-8 and a corresponding one of the inverters 122-1 through 122-8 forms a latch in which one element of the pair receives an output of the other element as an input. An initial state created by the reset signal R is thus kept even after the reset signal R returns to HIGH.

In this initial state, the output TC1 of the NOR circuit 121-1 is HIGH as shown in FIG. 6, and the remaining NOR circuits 121-2 through 121-8 have the outputs TC2 through TC8, respectively, which are LOW. That is, only the output TC1 is HIGH among the outputs TC1 through TC8.

When there is a need to increase the amount of delay with respect to a signal subjected to phase adjustment, HIGH pulses are supplied to signal lines A and B in turn. With a HIGH pulse of a signal ΦSE supplied to the signal line A, the NMOS transistor 124-1 is turned on. Since the NMOS transistor 126-1 is in a turned-on state, an output of the NAND circuit 123-1 is connected to the ground, and is forced to change from HIGH to LOW, so that an output of the inverter 122-1 becomes HIGH. This condition is latched by the latch comprising the NAND circuit 123-1 and the inverter 122-1. As a result, the output TC2 is changed from LOW to HIGH. In this condition, therefore, only the outputs TC1 and TC2 are HIGH.

With a HIGH pulse of a signal ΦSO supplied to the signal line B, the NMOS transistor 124-2 is turned on. Since the NMOS transistor 126-2 is already in a turned-on state, an output of the NAND circuit 123-2 is connected to the ground, and is forced to change from HIGH to LOW, so that an output of the inverter 122-2 becomes HIGH. This condition is latched by the latch comprising the NAND circuit 123-2 and the inverter 122-2. As a result, the output TC1 is changed from HIGH to LOW, while the output TC3 is turned from LOW to HIGH. In this condition, therefore, only the outputs TC2 and TC3 are HIGH.

As described above, HIGH pulses are supplied in turn to the signal lines A and B to shift a position to the right one by one when this position marks the only two HIGH outputs among the outputs TC1 through TC8.

When there is a need to decrease the delay amount, HIGH pulses are supplied to signal lines C and D in turn. Operations in this case are simply a reverse of the above-described operations, and a description thereof will be omitted.

The output signals TC1 through TC8 generated in this manner are supplied to the variable-delay circuit so as to adjust a delay of a signal when this signal is subjected to a phase adjustment.

Signals ΦSE, ΦSO, ΦRE, and ΦRO are supplied to the signal lines A through D. These signals ΦSE, ΦSO, ΦRE, and ΦRO are generated by the phase-comparison circuit 16 of FIG. 3.

Figure 7:
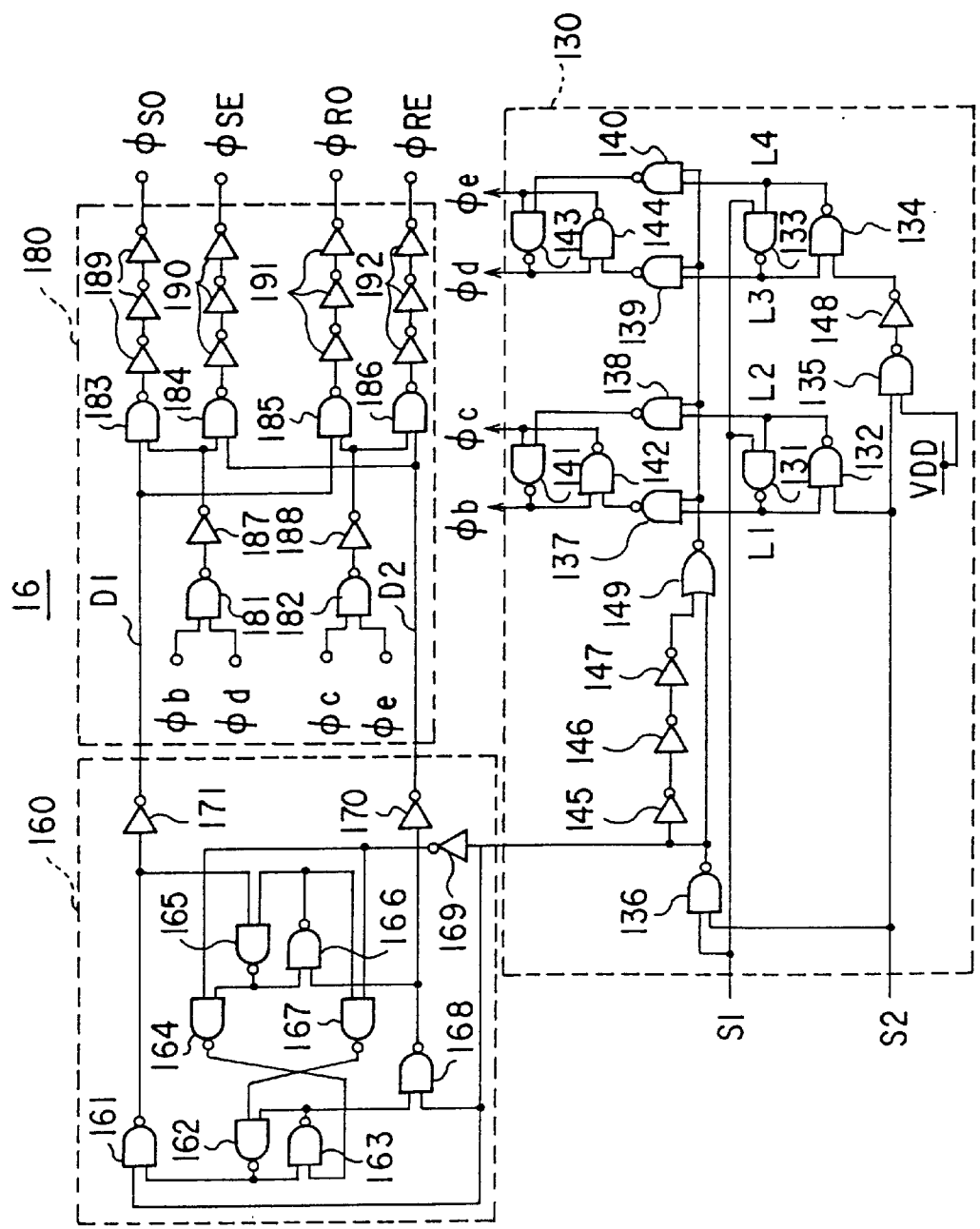
FIG. 7 is a circuit diagram showing a circuit configuration of a phase-comparison circuit.

FIG. 7 is a circuit diagram showing a circuit configuration of the phase-comparison circuit 16.

The phase-comparison circuit 16 of FIG. 7 includes an edge-timing-comparison circuit 130, a binary counter 160, and a pulse-generation circuit 180.

The edge-timing-comparison circuit 130 includes NAND circuits 131 through 144, inverters 145 through 148, and a NOR circuit 149. The binary counter 160 includes NAND circuits 161 through 168 and inverters 169 through 171. The pulse-generation circuit 180 includes NAND circuits 181 through 186 and inverters 187 through 192.

The edge-timing-comparison circuit 130 receives input signals S1 and S2, and determines which one of the input signals S1 and S2 has a rising edge ahead of the other. One of the input signals S1 and S2 corresponds to the reference-clock signal c-clk, and the other corresponds to the clock signal t-clk supplied from the dummy-input circuit 19.

If a rising edge of the input signal S1 is ahead of a rising edge of the input signal S2, a latch comprised of the NAND circuits 131 and 132 produces outputs L1 and L2 which are LOW and HIGH, respectively. Also, a latch formed by the NAND circuits 133 and 134 generates output L3 and L4 which are LOW and HIGH, respectively.

After this, both of the input signals S1 and S2 become HIGH, which changes an output of the NAND circuit 136 to LOW. This prompts the NOR circuit 149 to produce a HIGH output for a predetermined period of time. The HIGH output of the NOR circuit 149 opens gates of the NAND circuits 137 through 140, so that the latch outputs L1 through L4 are inverted and input to two latches comprised of NAND circuits 141 through 144. The latch comprised of NAND circuits 141 and 142 thus has outputs Φb and Φc which are HIGH and LOW, respectively. Also, the latch comprised of NAND circuits 143 and 144 has outputs Φd and Φe which are HIGH and LOW, respectively.

In this manner, when the input signal S1 has a rising edge ahead in time, the NAND circuit 181 of the pulse-generation circuit 180 changes an output thereof to LOW.

When a rising edge of the input signal S2 is ahead of a rising edge of the input signal S1 by a sufficient margin, the latch outputs Φb and Φc become LOW and HIGH, respectively, and, also, the latch outputs Φd and Φe become LOW and HIGH, respectively. In this case, therefore, the NAND circuit 182 of the pulse-generation circuit 180 changes an output thereof to LOW.

When a rising edge of the input signal S2 is ahead of a rising edge of the input signal S1 only by a small margin, the latch comprised of the NAND circuits 133 and 134 produces the outputs L3 and L4 which are LOW and HIGH, respectively, because of a signal delay introduced by the NAND circuit 135 and the inverter 148. In this case, the latch outputs Φb and Φc are LOW and HIGH, respectively, whereas the latch outputs Φd and Φe are HIGH and LOW, respectively. The NAND circuits 181 and 182 of the pulse-generation circuit 180 thus do not change outputs thereof, and these outputs remain at the HIGH level.

In this manner, when a difference in rising-edge timings between the input signal S1 and the input signal S2 is small, i.e., when the rising edges can be regarded as having the same timing output, the of the phase-comparison circuit 16 of FIG. 7 does not change.

The binary counter 160 divides a frequency of a signal by half when receiving the signal from the NAND circuit 136 of the edge-timing-comparison circuit 130. The binary counter 160 outputs a frequency-divided signal D1 from the inverter 171, and outputs a frequency-divided signal D2 from the inverter 170. The signal from the NAND circuit 136 has the same cycle as the input signals S1 and S2. Because of this, the frequency-divided signal D1 output from the binary counter 160 becomes HIGH during even-number cycles of the input signals, for example. In this case, the frequency-divided signal D2 becomes HIGH during odd-number cycles.

In the pulse-generation circuit 180, the output of the NAND circuit 181 becomes LOW when the input signal S1 is ahead of the input signal S2, as previously described. On the other hand, when the input signal S2 is ahead in time by a sufficient margin, the output of the NAND circuit 182 becomes LOW.

When the input signal S1 is ahead in time, the output of the NAND circuit 181 is inverted by the inverter 187, and is supplied to the NAND circuit 183 and 184 as a HIGH signal. The NAND circuit 183 further receives the frequency-divided signal D1, and the NAND circuit 184 further receives the frequency-divided signal D2. In this case, therefore, the pulse-generation circuit 180 generates HIGH pulses as the signal ΦSE or the signal ΦSO in turn When the input signal S2 is ahead in time by a sufficient margin, the output of the NAND circuit 182 is inverted by the inverter 188, and is supplied to the NAND circuit 185 and 186 as a HIGH signal. The NAND circuit 185 further receives the frequency-divided signal D1, and the NAND circuit 186 further receives the frequency-divided signal D2. In this case, therefore, the pulse-generation circuit 180 generates HIGH pulses as the signal ΦRO and the signal ΦRE in turn.

These signals ΦSE, ΦSK, ΦRE, and ΦRO are supplied to the delay-control circuit 17 shown in FIG. 6. In this manner, the delay of the variable-delay circuit of FIG. 5 can be controlled via the delay-control circuit 17 of FIG. 6, depending on which one of the signals S1 and S2 has a rising edge ahead of the other.

Figure 8:
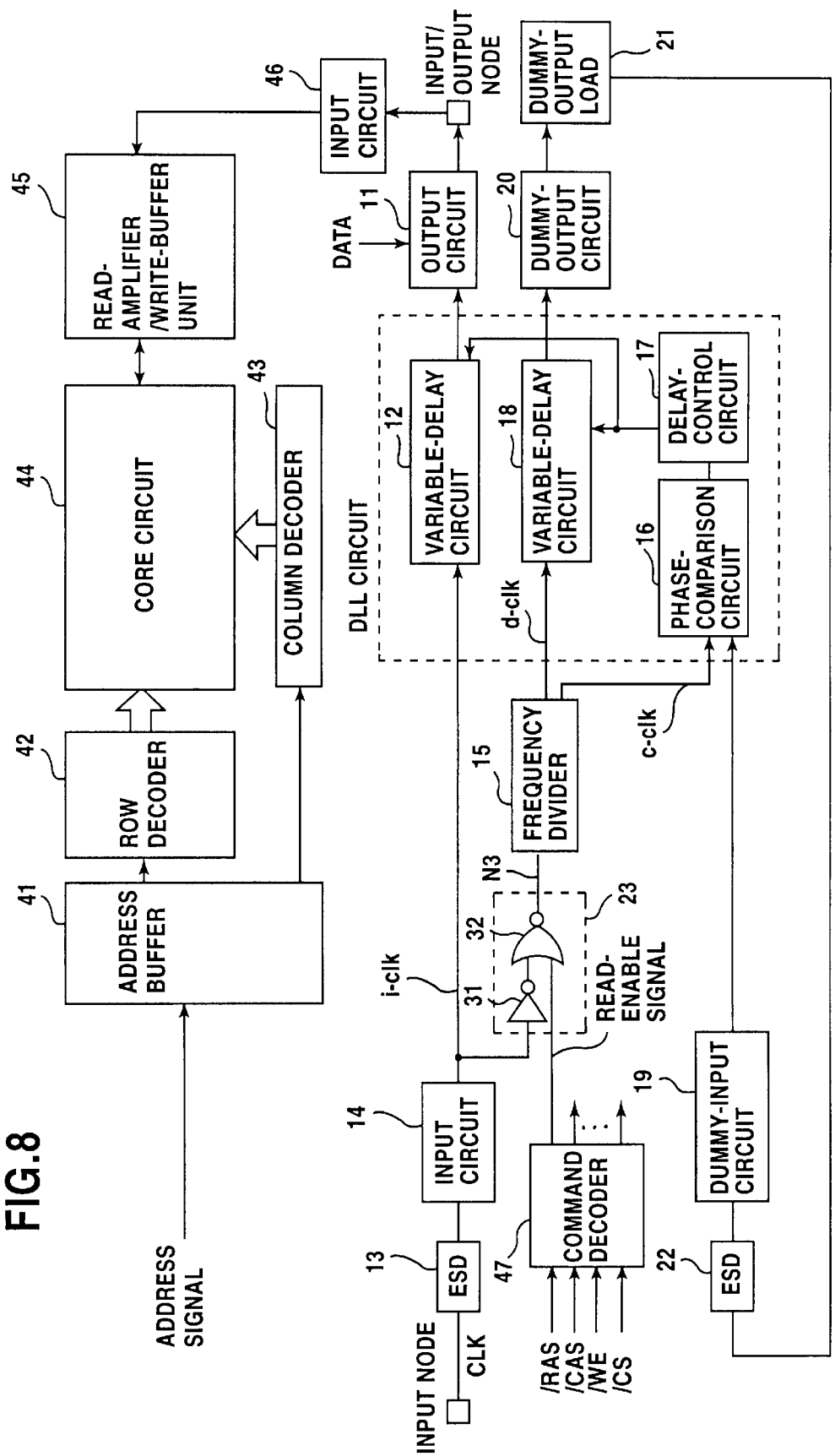
FIG. 8 is a block diagram of a semiconductor memory device in which a DLL circuit is used as a timing-stabilization circuit according to the present invention.

FIG. 8 is a block diagram of a semiconductor memory device in which a DLL circuit is used as a timing-stabilization circuit according to the present invention. In FIG. 8, the same elements as those of FIG. 3 are referred to by the same numerals, and a description thereof will be omitted.

The semiconductor memory device of FIG. 8 includes an address buffer 41, a row decoder 42, a column decoder 43, a core circuit 44, a read-amplifier/write-buffer unit 45, an input circuit 46, and a command decoder 47. These elements are generally provided in a conventional DRAM, and a description of circuit configurations will be omitted.

The core circuit 44 includes memory cells arranged in a matrix for storing data, word lines for accessing memory cells at an indicated row address, bit lines for reading data from the memory cells, sense amplifiers for amplifying the data on the bit lines, column gates for reading/writing data from/in sense amplifiers at an indicated column address, etc.

Address signals are input to the address buffer 41. A row address is then supplied to the row decoder 42, while a column address is supplied to the column decoder 43. The row decoder 42 prompts a word line to be activated at an indicated row address in order to perform row-address access to memory cells at this row address.

Data read from the memory cells is stored in the sense amplifiers via the bit lines. The column decoder 43 opens a column gate with respect to a sense amplifier corresponding to an indicated column address, thereby reading data from the sense amplifier to the read-amplifier/write-buffer unit 45. The data read from the sense amplifier is then output to an exterior of the semiconductor memory device via the output circuit 11.

When data is to be written, data input to an input/output node is supplied to the read-amplifier/write-buffer unit 45 via the input circuit 46. The data is then stored in a memory cell corresponding to a selected row address after passing through a column gate corresponding to a selected column address, a corresponding sense amplifier, and a corresponding bit line.

The command decoder 47 receives control signals /RAS (row-address strobe), /CAS (column-address strobe), /WE (write enable), and /CS (chip select). The command decoder 47 decodes these control signals, and outputs a plurality of signals indicative of decoding results. The plurality of signals are supplied to relevant internal circuits of the semiconductor memory device, thereby controlling an operation of the semiconductor memory device. One of the plurality of signals indicative of the decoding results is the read-enable signal. This read-enable signal is used for controlling a data-read operation of the semiconductor memory device and for controlling the control circuit 23.

In the same manner as in FIG. 3, the semiconductor memory device of FIG. 8 is provided with the control circuit which stops a phase-comparison operation and a phase-adjustment operation by the DLL circuit during a time period of data output. Because of this, even when a noise is generated in a power voltage by the data-output operation, the DLL circuit does not set a wrong timing. This makes it possible to output data at an appropriate timing regardless of a presence of the power-voltage noise.

Further, the present invention is not limited to these embodiments, but various variations and modifications may be made without departing from the scope of the present invention.

What is claimed is:

1. A semiconductor device comprising:

a timing-stabilization circuit which is driven by a power-supply voltage and adjusts a phase of a synchronization clock signal generated from an external clock signal;

an output circuit which outputs data to an exterior of said semiconductor device in synchronism with the synchronization clock signal having the phase thereof adjusted by said timing-stabilization circuit, said output circuit causing a fluctuation in the power-supply voltage when outputting the data to the exterior of said semiconductor device; and a control circuit which suspends the adjustment of the phase of the synchronization clock signal by said timing-stabilization circuit during a time period when said data is output from said output circuit.

2. The semiconductor device as claimed in claim 1, wherein said timing-stabilization circuit includes a DLL circuit.

3. The semiconductor device as claimed in claim 1, wherein said timing-stabilization circuit comprises:

a first variable-delay circuit which adjusts said phase of said synchronization clock signal;

an emulation circuit which includes a second variable-delay circuit having a delay amount thereof set to the same amount as that of said first variable-delay circuit, and emulates a phase relation between said external clock signal and an output timing of the data output from said output circuit;

a phase-comparison circuit which checks said phase relation emulated by said emulation circuit; and a delay-control circuit which adjusts said delay a mount of said first variable-delay circuit and said second variable-delay circuit bas ed on a check made by said phase-comparison circuit.

4. The semiconductor device as claimed in claim 3, wherein said control circuit supplies a clock signal derived from said external clock signal to said emulation circuit and said phase-comparison circuit to prompt performing of said adjustment of the phase of the synchronization clock signal during a time period when said data is not output from said output circuit, and stops supply of said clock signal derived from said external clock signal to said emulation circuit and said phase-comparison circuit to stop said adjustment of the phase of the synchronization clock signal during said time period when said data is output from said output circuit.

5. The semiconductor device as claimed in claim 4, wherein said control circuit learns whether said data is being output from said output circuit based on a signal which instructs outputting of said data to said exterior of said semiconductor device.

6. The semiconductor device as claimed in claim 5, wherein said signal which instructs outputting of said data to said exterior of said semiconductor device is set based on an input from said exterior of said semiconductor device.

* * * * *